(12) United States Patent
James et al.

(10) Patent No.: US 10,585,135 B2
(45) Date of Patent: Mar. 10, 2020

(54) BUILT IN TEST OF REMOTE ISOLATION

(71) Applicant: Hamilton Sundstrand Corporation, Charlotte, NC (US)

(72) Inventors: Joseph A. James, Tempe, AZ (US); Henry Soekmadji, Phoenix, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 304 days.

(21) Appl. No.: 15/634,807

(22) Filed: Jun. 27, 2017

(65) Prior Publication Data
US 2018/0372790 A1    Dec. 27, 2018

(51) Int. Cl.
| | | |
|---|---|---|
| G01R 33/28 | (2006.01) | |
| G01R 33/14 | (2006.01) | |
| G01R 31/14 | (2006.01) | |
| G01R 27/02 | (2006.01) | |
| H02H 3/16 | (2006.01) | |
| G01R 31/28 | (2006.01) | |

(52) U.S. Cl.
CPC .......... *G01R 31/14* (2013.01); *G01R 27/025* (2013.01); *G01R 31/2884* (2013.01); *H02H 3/16* (2013.01)

(58) Field of Classification Search
CPC .. G01R 27/025; G01R 31/14; G01R 31/2884; H02H 3/16
USPC ......................................................... 324/551
See application file for complete search history.

(56) References Cited

U.S. PATENT DOCUMENTS

| | | |
|---|---|---|
| 4,254,495 A | 3/1981 | Bollard |
| 4,345,251 A | 8/1982 | Begeman et al. |
| 4,414,539 A | 11/1983 | Armer |
| 6,448,914 B1 | 9/2002 | Younis et al. |
| 6,678,132 B1 * | 1/2004 | Carruthers ............ B60L 3/0023 361/42 |
| 9,255,957 B2 * | 2/2016 | Arima ...................... H02H 3/16 |
| 2014/0104734 A1 | 4/2014 | Prisse et al. |
| 2017/0108544 A1 | 4/2017 | Schmelzer |

FOREIGN PATENT DOCUMENTS

| | | |
|---|---|---|
| JP | 2017044586 A | 3/2017 |
| WO | 2014049247 A1 | 4/2014 |

OTHER PUBLICATIONS

European Search Report for Application No./Patent No. 18180127.5-1202 dated Nov. 28, 2018; 8 pgs.

* cited by examiner

*Primary Examiner* — Reena Aurora
(74) *Attorney, Agent, or Firm* — Cantor Colburn LLP

(57) ABSTRACT

Embodiments herein relate to a system and method for detecting a degraded isolation impedance in a positively sourced remote load. The system includes a remote load driven by a direct current (DC) source, and a controller operably connected to the remote load having a positive sourcing driver interface with a dedicated return having the DC source on an output leg and a dedicated return leg. The positive sourcing driver also including a switching device configured controllably connect a DC voltage supply to the output leg of the DC voltage source, a first impedance operably connected between the output leg and ground, a second impedance operably connected between the dedicated return leg and a negative voltage supply, and a clamping and limiting device operably connected in series between the dedicated return leg and ground, the clamping device configured to limit a positive voltage on the return leg.

13 Claims, 3 Drawing Sheets

BUILT IN TEST OF REMOTE ISOLATION

TECHNICAL FIELD

The present disclosure relates to a monitoring Built In Test (BIT) for Lightning Pin Injection in an aircraft application. In particular, the disclosure relates to a BIT for measuring impedance between load conductors and chassis ground.

BACKGROUND

Modern aircraft have a plurality of control surfaces, systems, actuators, torques, temperatures, and the like which need to be monitored to ensure proper operation of the aircraft. In order to be able to monitor the various aircraft parameters, sensors are used on the individual control surfaces, actuators, and engines to detect the various parameters. The values detected by the sensors can subsequently be employed for instrumentation, used to generate control commands, and for various diagnostics. With diagnostic applications, the values detected by the sensors may be compared with predetermined values for a given parameter under selected conditions and a malfunction can be identified in the event a deviation is detected by the respective sensor from the predetermined values.

A variety of sensors and actuators may be employed depending on the application. Sensors such as rotary or Linear Variable Differential Transformer sensors (RVDT or LVDT sensors), synchros and resolvers are conventionally used as sensors in aircraft because they are very robust with respect to external disturbances and have simple construction. However, in other applications, potentiometers and some low-level sensors are also commonly employed. Likewise, actuators may include valves, solenoids, relays, motors, brakes, and the like.

When sensors are used to detect various aircraft parameters, the sensors used must typically be monitored to ensure error free operation. Failures of sensors, and/or the wiring harness, or controller interfaces to sensors impact system reliability and result in a need for redundancy and overdesign to ensure operation. It is also desirable to ensure that potential failures are not only detectable, but also, preferably relegated to lesser importance and minimized impact on system reliability. Similarly, actuators are employed to move controls, control surfaces and the like to manipulate and control aircraft parameters, therefore commonly is it also desirable to monitor the operation of actuators to ensure error free operation. Failures of actuators and/or the wiring harness, or controller interfaces to them impact system reliability and result in a need for redundancy and overdesign to ensure operation. It is also desirable to ensure that potential failures are not only detectable, but also, preferably relegated to lesser importance and minimized impact on system reliability.

Some testing includes lightning protections. Qualification testing for lightning pin injection on sourced outputs permits use of an estimated 'remote load impedance', which is the equivalent impedance presented by the equipment between the load conductors and chassis (Earth) ground of the remote load. Furthermore, continued air-worthiness requirements dictate that lightning protection circuits should be testable, preferably by Built in Test (BIT), but at a minimum through component acceptance testing. Unfortunately, current BIT techniques do not have the capability to measure the remote load impedance, so taking advantage of its permitted use during qualification test or as part of a continued air-worthiness analysis is not available. Therefore, it is desirable to have a BIT capability that includes determination of remote load impedance where possible.

BRIEF DESCRIPTION

According to one embodiment of the invention, described herein is a system and method for detecting a degraded isolation impedance in a positively sourced remote load. The system includes a remote load driven by a direct current (DC) source, and a controller operably connected to the remote load having a positive sourcing driver interface with a dedicated return having the DC source on an output leg and a dedicated return leg. The positive sourcing driver also including a switching device configured controllably connect a DC voltage supply to the output leg of the DC voltage source, a first impedance operably connected between the output leg and ground, a second impedance operably connected between the dedicated return leg and a negative voltage supply, and a clamping and limiting device operably connected in series between the dedicated return leg and ground of the controller, the clamping device configured to limit a positive voltage on the return leg.

In addition to one or more of the features described above, or as an alternative, further embodiments may include that the first impedance and the second impedance is selected so that an appreciable voltage may be measured at the voltage divider.

In addition to one or more of the features described above, or as an alternative, further embodiments may include that the first impedance and the second impedance is selected to be about 10% of the expected value of the isolation impedance of the remote load.

In addition to one or more of the features described above, or as an alternative, further embodiments may include that the first and the second impedance is a resistor of at least one of 50 kΩ, 100 kΩ, 200 kΩ, 500 kΩ and one Mega Ohm.

In addition to one or more of the features described above, or as an alternative, further embodiments may include that the clamping and limiting device is at least one of a diode, Zener diode, and transistor.

In addition to one or more of the features described above, or as an alternative, further embodiments may include that the positive voltage supply is 28 VDC.

In addition to one or more of the features described above, or as an alternative, further embodiments may include that the switching device is at least one of a switch, relay, contactor, transistor, FET, MOSFET, thyristor, and triac.

In addition to one or more of the features described above, or as an alternative, further embodiments may include that the remote load is at least one of an actuator, valve, solenoid, and brake.

In addition to one or more of the features described above, or as an alternative, further embodiments may include that the controller is configured to execute a method including applying a first high impedance pull down to ground on the output leg of a positive sourcing driver interface of the controller, applying a second high impedance pull down to a negative voltage supply on the return leg of a positive sourcing driver interface, clamping and limiting the return leg of the positive sourcing driver interface to a fixed positive voltage, measuring a voltage across the first high impedance pulldown with the positive sourcing driver inactive, determining if a degradation or loss of the isolation impedance at the remote load based on the measured voltage, and identifying the isolation impedance as degraded based on the determining.

In addition to one or more of the features described above, or as an alternative, further embodiments may include that the controller includes a data acquisition system.

In addition to one or more of the features described above, or as an alternative, further embodiments may include that the controller is configured to execute a built in test function.

In addition to one or more of the features described above, or as an alternative, further embodiments may include that the built in test function includes a step of the controller applying a known stimulus as excitation to the remote load and monitoring a response.

In addition to one or more of the features described above, or as an alternative, further embodiments may include that the built in test function identifies at least one of: a short circuit and an open circuit.

Also described herein in an embodiment is a method of detecting a degraded isolation impedance in a positively sourced remote load operably connected to a controller with positive sourcing driver interface and a dedicated return having the DC source on an output leg and a dedicated return leg, the controller configured to execute a method. The method includes applying a first high impedance pull down to ground on the output leg of a positive sourcing driver interface of the controller, applying a second high impedance pull down to a negative voltage supply on the return leg of a positive sourcing driver interface, clamping and limiting the return leg of the positive sourcing driver interface to a fixed positive voltage, measuring a voltage across the first high impedance pulldown with the positive sourcing driver inactive, determining if a degradation or loss of the isolation impedance at the remote load based on the measured voltage, and identifying the isolation impedance as degraded based on the determining.

In addition to one or more of the features described above, or as an alternative, further embodiments may include operably connecting the first impedance and second impedance to form a voltage divider with the remote load and the isolation impedance thereof.

In addition to one or more of the features described above, or as an alternative, further embodiments may include generating an excitation signal and transmitting it to the remote load.

In addition to one or more of the features described above, or as an alternative, further embodiments may include executing the method as part of a built in test function.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
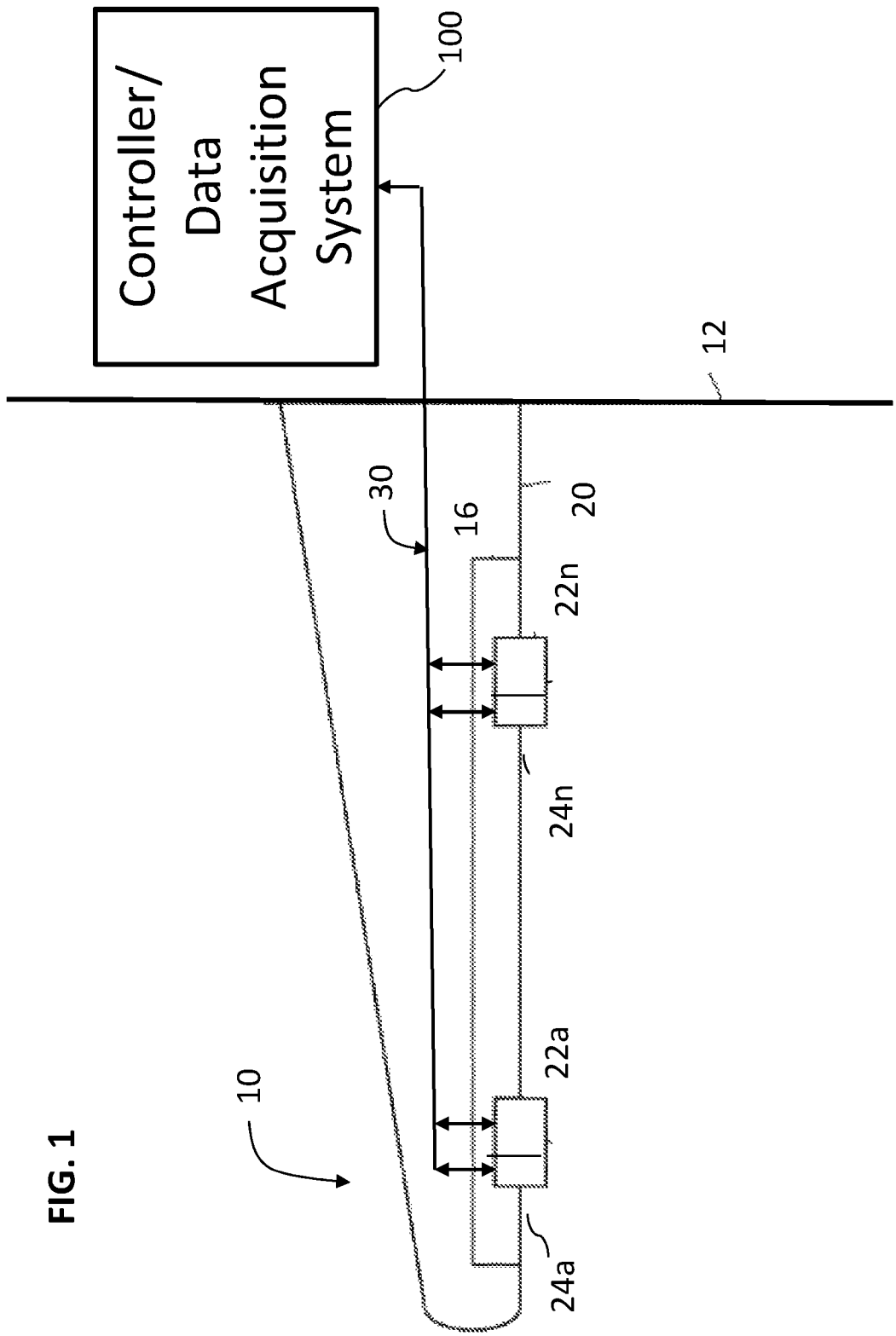
FIG. 1 depicts a simplified diagram of an aircraft data acquisition system in accordance with an embodiment.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an Application Specific Integrated Circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

In general, embodiments herein relate generally to a non-invasive Built In Test (BIT) that measures load impedance of a remotely connected load e.g. an actuator while an output is not activated. In particular, on a positive sourcing output driver with dedicated ground returns, a circuit configuration that facilitates determination of the driver load isolation impedance or at least, an evaluation that the impedance is high e.g., on the order of 100 KOhms. Turning now to FIG. 1, a simplified diagram of a control or data acquisition system 10 on an aircraft 12 (partially shown) is depicted. The control system 10 includes, but is not limited to a control surface 16 depicted in this instance, on an aircraft wing 20. The control system 10 includes one or more sensors 22a, 22b . . . 22n configured to measure any of a variety of aircraft parameters or actuators 24a, 24b . . . 24n. For example, in this instance, sensors 22a, 22b . . . 22n may measure displacement or displacement speed of the control surface 16. Other parameters include, but are not limited to, temperatures, pressures, strains, and the like. The sensors 22a, 22b . . . 22n could be any configured to measure the aircraft parameter including RVDTs, LVDTs, potentiometers, thermocouples, bimetallic thermocouples, strain gauges, and the like. Likewise, the actuators 24a, 24b . . . 24n may include motors, valves solenoids and the like for controlling various devices on the aircraft 12. For example, an actuator 24a, 24b . . . 24n may control the position of a control surface 16 or flow of fuel and the like. While the following descriptions of the embodiments will be made with respect to application of positive sourcing outputs, such as 28 Volts Direct Current (VDC) output drivers, it will be appreciated that the described embodiments may readily be applied to other output drivers and voltage levels and particularly any DC drivers. In an embodiment the sensors 22a, 22b. . . 22n and actuators or loads 24a, 24b. . . 24n may be interconnected with a controller 100. The interconnection 30 could be a simple wiring harness, bus configuration or any form of wireless communication as is known in the art.

Figure 2:
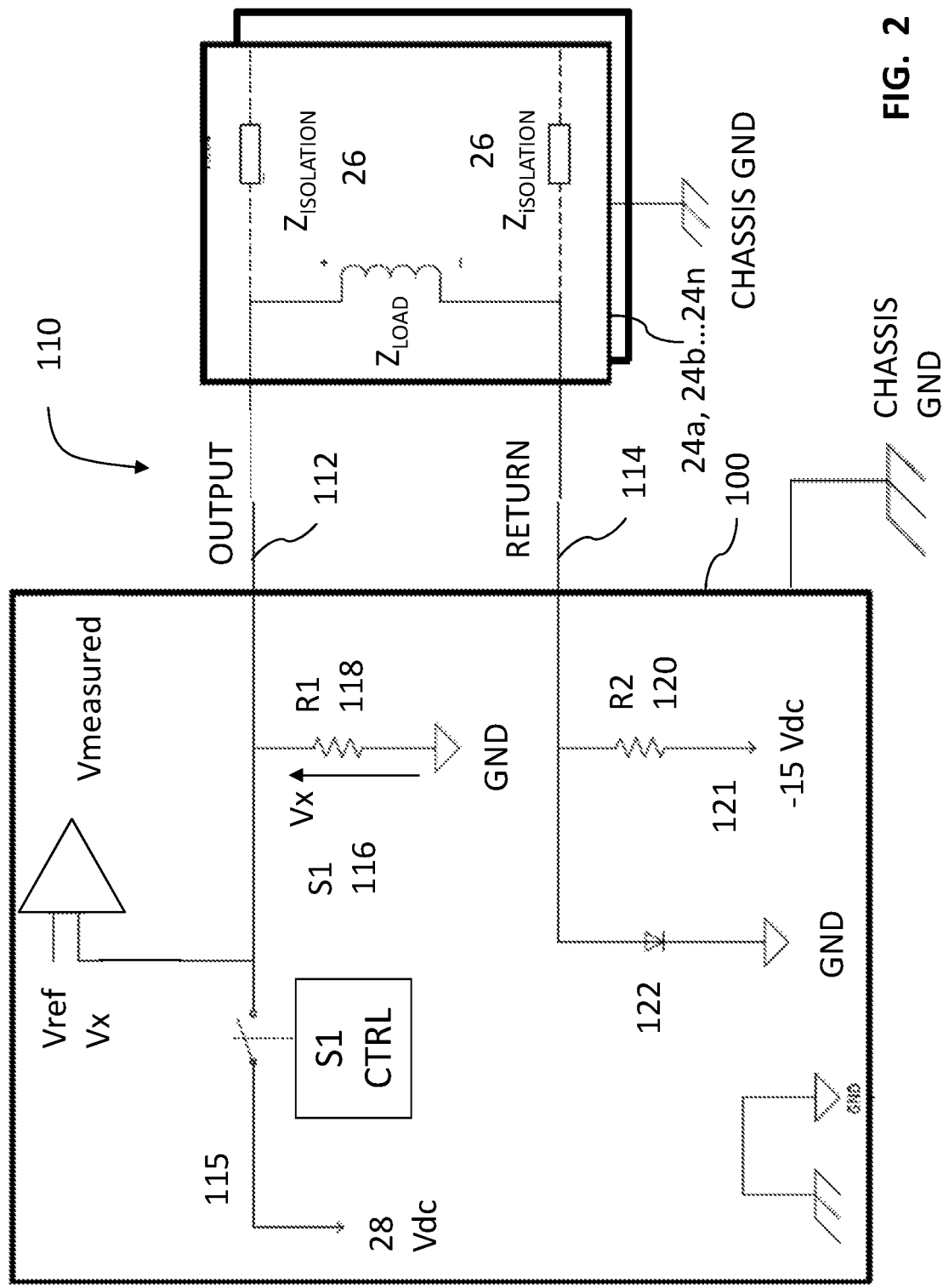
FIG. 2 depicts a simplified schematic of conventional controller and remote load interfaces for isolation impedance detection.

Referring now to FIG. 2 as well, where a simplified diagram of a positive sourcing output driver interface 110 in the controller 100 in accordance with an embodiment is depicted. When an actuator 24a-24n is employed in application as a remote load on the aircraft 12, the controller 100 typically provides (sources) a direct current (DC) excitation voltage on an output leg 112 to control or actuate the actuator 24a-24n. In addition, in an embodiment, a dedicated return leg 114 provides the ground path for the current sourced to the remote load e.g., the actuator 24a-24n. The voltage sourced may be provided via a switching device or controller 116 (also labeled as S1 or via amplifier and the like connected to a voltage bus or supply 115, in an embodiment, 28 Vdc. The switching device 116 may be any sort of controllable electromechanical devices such as a switch, relay, contactor and the like, or the switching device 116 may be or include a semiconductor type device such as a transistor, FET, MOSFET, thyristor, triac, and the like.

The remote load or actuator 24a-24n exhibits an impedance presented to the controller output. This impedance is typically very small, for example on the order of ohms for a conventional coil, and the like. However, also of importance to the testing of a positive sourcing output driver 110 for a controller 100, are the isolation impedances 26 (identified as $Z_{ISOLATION}$) exhibited by the remote load (actuator 24a-24n)) with respect to its chassis ground. Typically, isolation impedance 26 is on the order of mega Ohms (MΩ) are expected. Ensuring that these isolation impedances 26 are maintained and their relative magnitude to the load impedance are important for equipment level lightning testing. Qualification testing for lightning pin injection, where voltage transients are introduced simulating lightning strikes on the aircraft 12, on sourced outputs 110 permits use of an estimated 'remote load impedance', which is the equivalent impedance presented by the actuator 24a-24n between the load conductors and chassis (Earth) ground of the remote load or the actuator 24a-24n. In addition, lightning protection circuits should be testable, preferably by Built in Test (BIT). Therefore identifying during testing or BIT the relative magnitude of these impedances is advantageous for testing the system and ensuring correct functional testing and satisfactory airworthiness testing. To not consider the remote load impedance may have negative effect on testing and result in overdesigning protection circuits to withstand the injected voltage and current transients required by the lightning tests.

Continuing with FIG. 2, in an embodiment the positive sourcing driver interface 110 of the controller 100 also includes two impedances, first impedance 118 and second impedance 120, as well as a voltage clamp 122. In an embodiment, the first impedance 118 is connected as a pull down from positive sourced voltage as provided by the switching device 116 to a first voltage supply. In an embodiment, the first impedance 118 is fairly large to avoid loading the voltage source and supply 115 and dissipating excessive currents, but also smaller than the expected magnitude of the expected isolation impedance 26. In one embodiment the first impedance and the second impedance is selected so that an appreciable voltage may be measured at the voltage divider. Moreover, the first impedance and the second impedance may be selected to be about 10% of the expected value of the isolation impedance of the remote load. For example, in an embodiment where the expected isolation impedance is on the order of MΩ, the impedance 118 is on the order of kilo Ohms (kΩ). In an embodiment a 100 kΩ resistance is employed, however other values such as 50 kΩ, 100 kΩ, 200 kΩ s, 500 kΩ and one MΩ are possible. Likewise, a second impedance 120 is employed as a pull down from the return leg 114 to a second supply voltage 121. Once again in an embodiment, where the expected isolation impedance 26 is on the order of MΩ, the second impedance 120 is on the order of kilo Ohms (kΩ). In an embodiment a 100 kΩ resistance is employed, however other values such as 50 kΩ, 100 kΩ, 200 kΩ, 500 kΩ and one MΩ are possible. In an embodiment, the first voltage supply is typically ground and the second voltage supply is typically a negative voltage, (e.g., shown in the figure as −15 Vdc). In another embodiment they could be reversed and the first voltage supply could be a negative voltage and the second voltage supply could be ground or zero volts. It should be appreciated that the exact values of the first and second impedances are not critical, only that they be sufficiently large to facilitate establishing a voltage divider with the isolation impedance 26 of the remote load (e.g., actuator 24a-24n) such that the voltage is detectable. In addition a voltage clamp 122 employed in series with the return leg 114. In an embodiment a forward biased diode operates as the voltage clamp 122 to ground of the controller 100 ensuring that in operation the positive sourcing driver 110 is not impacted. In another embodiment the voltage clamp could be a diode, Zener diode, transistor and the like as would be well understood in the art.

In operation, in an embodiment, when the positive sourcing driver interface 110 is not operating, the first and second impedance 118 and 120 operate in conjunction with the isolation impedance 26 of the remote load, e.g., actuator 24a-24n and the impedance of the actuator 24a-24n itself to formulate a voltage divider. As stated earlier it is expected that the impedance of the remote load, e.g., the actuator 24a-24n is much smaller than the isolation impedance 26. For example, the impedance of the load $Z_{load}$ is on the order of ohms, while the isolation impedance $Z_{isolation}$ 26 is on the order of MΩ. When the voltage source is not operating the voltage divider is formed that results in a voltage at $V_x = -15(R1//Z_{isolation})/(R2+R1//Z_{isolation})$. It should be noted that because $Z_{isolation}$ is so large compared to $Z_{load}$, and it could be on either side of $Z_{load}$, (as shown in the figure) it is only used once in the equation.

If the $Z_{isolation}$ is large as expected, (~MegaOhms), indicating a good isolation between $Z_{load}$ and chassis of the remote load or actuator 24a-24n, then, the voltage divider of the interconnected circuit simplifies to; $V_x = -15(R1)/(R2+R1) = -7.5$ V; when the supply voltage on the pull down for resistor 120 (R2) is −15 Vdc. Furthermore, under a potential fault condition when the isolation impedance 26 at the remote load is low, indicating a degradation in the isolation (i.e., a fault at the actuator 24a-24n), the voltage divider is impacted and detectable. For example, if $Z_{isolation}$ is small (<100 kΩ) or on the order of 10 kΩ, when R1=R2=100 KOhms, then the voltage divider yields: $V_x = -15(10 \text{ k}//100 \text{ k})/(100 \text{ k}+100 \text{ k}//10 \text{ k}) = -1.25$ V. Therefore a change in the isolation impedance at the actuator 24a-24n is detectable. In an embodiment a degradation in the isolation impedance of a remote load 26 e.g. actuator 24a-24n can be detected/ measured by the controller during its initialization by means of BIT. In an embodiment the voltage $V_x$ measured across the first impedance 118 e.g., pulldown resistor (R1) exhibits a broad range sufficient for detection and evaluation. In an embodiment, a 10:1 ratio is possible, identifying sufficient isolation vs. degraded isolation. As a result of the testing as may be conducted as part of a BIT, a failure or warning may be reported by the controller to ensure continued airworthiness and to validate the use of series resistance during the pin injection lightning testing per current standards.

It will be appreciated that while the embodiments herein have been described with respect to detecting/mitigating degradation or loss of isolation impedance at a remote load, detection of other potential failure modes is also possible. For example, during power on or initiated built in test (PBIT, IBIT), when the sensors 22a-22n are not being used in application, an external wiring, sensor or open circuity may optionally be detected. For example, applying known stimulus to the sensor 22a-22n or actuator 24a-24n and monitoring the voltage developed across the resistors 118 and 120 to yield an expected response. Moreover, during an PBIT, IBIT, test voltages and currents may be applied to the sensors and actuators to ensure no other failures are detected. For example, during PBIT, IBIT fault modes that may be detected by conventional BIT methods include, but may not be limited to: an open circuits shorted wiring.

Figure 3:
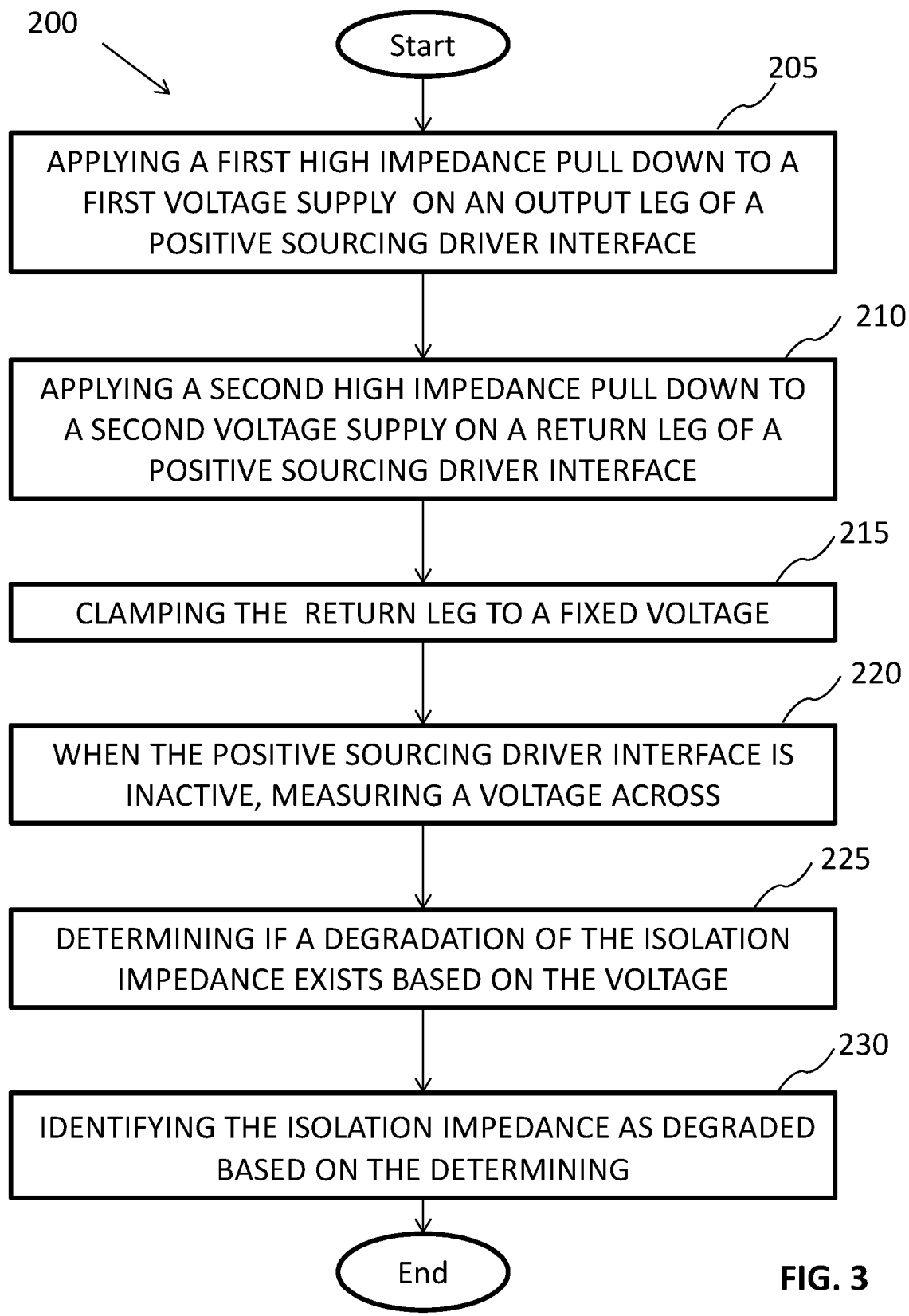
FIG. 3 is a flow chart depicting a method of detecting an open circuit in a low-level sensor signal in accordance with an embodiment.

Turning now to FIG. 3, a flowchart of the method 200 of detecting degradation in an isolation impedance at a remote load is depicted. In accordance with the embodiments described herein the method is initiated at process step 205 of applying a first high impedance pull down to ground on an output leg of a positive sourcing driver interface 110 of a controller 100. As depicted at step 210, the method also includes applying a second high impedance pull down to a negative voltage supply on a return leg of a positive sourcing driver interface 110. The method continues at process step 215, with clamping and limiting the return leg of the positive sourcing driver interface 110 to a fixed positive voltage. With the positive sourcing driver 110 inactive, measuring a voltage across the first high impedance pulldown as depicted at process step 220. Based on the measured signal, a determination is made if a degradation or loss of the isolation impedance 26 at the remote load e.g., actuator 24a-24n is present as depicted at process step 225. The degradation can be determined based of conventional voltage divider techniques to characterize the voltage signal measured. In one embodiment the voltage is equivalent to about half the negative supply is indicative of good isolation impedance 26 at the remote load e.g. actuator 24a-24n, while a voltage equivalent to about 10% of the negative supply voltage is indicative to a loss or degradation of isolation impedance 26. In this manner the controller 100 can identify the presence of an degradation or short in the isolation impedance 26 of the remote load. The controller 100 can then characterize, identify, and manage the failure as appropriate, such as annunciating the detected failure, identifying the remote load e.g., actuator 24a-24n for service, attempting corrective action, and/or electing to ignore the remote load exhibiting the degraded condition as depicted at process step 230.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system for detecting a degraded isolation impedance in a positively sourced remote load, the system comprising:
    a remote load configured to be driven by a direct current (DC) source;
    a controller operably connected to the remote load having a positive sourcing driver interface with a dedicated return having the DC source on an output leg and a dedicated return leg, the positive sourcing driver also including:
        a switching device configured controllably connect a DC voltage supply to the output leg of the DC voltage source;
        a first impedance operably connected between the output leg and ground;
        a second impedance operably connected between the dedicated return leg and a negative voltage supply;
        a clamping and limiting device operably connecting the dedicated return leg and ground, the clamping device configured to limit a positive voltage on the return leg;
        wherein the first impedance and the second impedance are operably connected to form a voltage divider with an isolation impedance of the load, the voltage (Vx) across the first impedance providing a voltage indicative of the isolation impedance.

2. The system for detecting a degraded isolation impedance in a positive sourced remote load of claim 1, wherein the first impedance and the second impedance is selected to be about 10% of the expected value of the isolation impedance of the remote load.

3. The system for detecting a degraded isolation impedance in a positively sourced remote load of claim 1, wherein the first and the second impedance is a resistor of at least one of 50 kΩ, 100 kΩ, 200 kΩ, 500 kΩ and one Mega Ohm.

4. The system for detecting a degraded isolation impedance in a positively sourced remote load of claim 1, wherein the clamping and limiting device is at least one of a diode, Zener diode, and transistor.

5. The system for detecting a degraded isolation impedance in a positively sourced remote load of claim 1, wherein the positive voltage supply is 28VDC.

6. The system for detecting a degraded isolation impedance in a positively sourced remote load of claim 1, wherein the switching device is at least one of a switch, relay, contactor, transistor, FET, MOSFET, thyristor, and triac.

7. The system for detecting a degraded isolation impedance in a positively sourced remote load of claim 6, wherein the remote load is at least one of an actuator, valve, solenoid, and brake.

8. The system for detecting a degraded isolation impedance in a positively sourced remote load of claim 1, wherein the first voltage supply is at least one of ground and a negative voltage, and the second voltage supple is the other of the ground and the negative voltage.

9. The system for detecting a degraded isolation impedance in a positively sourced remote load of claim 8, wherein the first voltage supply is ground and the second voltage supply is −15volts DC.

10. The system for detecting a degraded isolation impedance in a positively sourced remote load of claim 8, wherein the first voltage supply is ground and the second voltage supply is −15volts DC.

11. The system for detecting a degraded isolation impedance in a positively sourced remote load of claim 1, wherein the controller is configured to execute a method comprising:
applying a first high impedance pull down to ground on the output leg of a positive sourcing driver interface of the controller;
applying a second high impedance pull down to a negative voltage supply on the return leg of a positive sourcing driver interface;
clamping and limiting the return leg of the positive sourcing driver interface to a fixed positive voltage;
measuring a voltage across the first high impedance pulldown with the positive sourcing driver inactive; and
determining if a degradation or loss of the isolation impedance at the remote load based on the measured voltage; and
identifying the isolation impedance as degraded based on the determining.

12. The system for detecting a degraded isolation impedance in a positively sourced remote load of claim 1, wherein the controller is configured to execute a built in test function, and wherein the built in test function includes a step of the controller applying a known stimulus as excitation to the remote load and monitoring a response.

13. The system for detecting a degraded isolation impedance in a positively sourced remote load of claim 12, wherein the built in test function identifies at least one of: a short circuit and an open circuit.

\* \* \* \* \*